United States Patent [19]
Tanida et al.

[11] Patent Number: 5,715,212
[45] Date of Patent: Feb. 3, 1998

[54] SEMICONDUCTOR MEMORY DEVICE COMPRISING ADDRESS TRANSITION DETECTING CIRCUIT HAVING STABLE RESPONSE CHARACTERISTIC FOR ADDRESS SIGNAL CONVERSION

[75] Inventors: Susumu Tanida; Yasuhiko Tsukikawa, both of Hyogo, Japan

[73] Assignee: Mitsubishi Denki Kabushiki Kaisha, Tokyo, Japan

[21] Appl. No.: 652,038

[22] Filed: May 23, 1996

[30] Foreign Application Priority Data

Nov. 30, 1995 [JP] Japan ................. 7-312561

[51] Int. Cl.$^6$ ........................... G11C 8/00
[52] U.S. Cl. ...................... 365/233.5; 365/194
[58] Field of Search ............... 365/233.5, 230.06, 365/230.08, 194, 233

[56] References Cited

U.S. PATENT DOCUMENTS 5,056,064  10/1991  Iwahashi et al. ............ 365/233.5
5,305,284   4/1994  Iwase ......................... 365/233.5
5,319,607   6/1994  Fujii et al. .................. 365/233.5

FOREIGN PATENT DOCUMENTS 62-132292  6/1987  Japan.
6-111597   4/1994  Japan.

*Primary Examiner*—Joseph A. Popek
*Attorney, Agent, or Firm*—Lowe, Price, LeBlanc & Becker

[57] ABSTRACT

In an address transition detecting circuit, signal conversion detecting circuits output complementary time difference signals which are inverted in response to potential level changes of corresponding address lines respectively. Waveform shaping one-shot pulse generating circuits receive corresponding complementary time difference signals and output one-shot pulse signals of prescribed time widths. A waveform composing circuit outputs an ATD signal of a prescribed pulse length in response to activation of any one-shot pulse signal. Therefore, the lengths of the one-shot pulses outputted from the waveform shaping one-shot pulse generating circuits remain unchanged even if the potential level of any signal line is abruptly converted, and an ATD signal of a constant pulse length is regularly outputted.

7 Claims, 9 Drawing Sheets

SEMICONDUCTOR MEMORY DEVICE COMPRISING ADDRESS TRANSITION DETECTING CIRCUIT HAVING STABLE RESPONSE CHARACTERISTIC FOR ADDRESS SIGNAL CONVERSION

BACKGROUND OF THE INVENTION

1. Field of the Invention

The present invention relates to a semiconductor memory device, and more particularly, it relates to a semiconductor memory device which is capable of a high-speed stable access operation.

2. Description of the Background Art

In a semiconductor memory device such as a dynamic semiconductor memory device (hereinafter referred to as a DRAM) or a static semiconductor memory device (hereinafter referred to as an SRAM), address signals are generally supplied from the exterior through a plurality of address lines, in order to indicate which memory cells are to be accessed in a memory cell array. In the interior of the semiconductor memory device, the address signals which are applied to the address lines are decoded to access the corresponding memory cells. In this case, a method of regarding that a new address signal is applied when conversion of an address signal which is supplied to any one of address signal lines is detected may be employed as a method of detecting timings when the address signals are applied to the address lines.

Employed for the aforementioned timing detection is an address transition detecting circuit (hereinafter referred to as an ATD circuit).

In order to implement a high-speed column access operation in the semiconductor memory device, there is a mode of data-outputting a memory cell signal for a corresponding data line every time a column address is switched, as an operation mode of a DRAM, for example. In this mode, there is no external clock for synchronizing address signals, and hence substitutional means is necessary. The aforementioned ATD circuit is employed in this case. In order to increase the speed of this mode, it is important to increase the speed of signal transmission of an I/O line which is a signal line of reading data to the exterior. This is because the parasitic capacitance of an I/O line is generally high and forms a factor rate-controlling the data read speed.

In order to increase the aforementioned speed, it is necessary to quickly read the memory cell signal on the I/O line, i.e., to employ a main amplifier which can reduce the amplitude of the signal voltage on the I/O line and amplify the same at a high speed. To this end, it may be capable of quickly detecting address switching before an externally inputted address is switched and a data line corresponding to the switched address is selected. In this case, an operation of previously precharging the I/O line while regarding this detection signal as an internal clock and waiting for selection of the data line is enabled. The precharged voltage is selected at an intermediate value of a voltage corresponding to binary information on the I/O line, for example. Thus, the subsequently selected data line may be charged/discharged from the intermediate value with no necessity of especially inverting a previously selected and outputted information voltage remaining on the I/O line, whereby a high-speed operation is enabled.

A low-amplitude high-speed main amplifier is generally formed by a current mirror amplifier, which is disadvantageously regularly fed with a current. When an ATD circuit is employed, it is possible to bring the main amplifier into an ON state only for a short time zone which is necessary for amplification, while bringing the same into an OFF state in remaining times through the detection signal. Namely, a high-speed main amplifier having low power consumption can be implemented.

As hereinabove described, the ATD circuit is important for improving the performance of a column related circuit operation in the semiconductor memory device.

FIG. 9 shows an exemplary conventional ATD circuit 2000. In this example, it is assumed that address signals consist of three bits, and the number of corresponding address lines is three, for simplifying the illustration.

Referring to FIG. 9, the conventional ATD circuit 2000 includes signal conversion detecting circuits 200, 202 and 204 which receive potentials of address lines A1, A2 and A3 respectively, one-shot pulse generating circuits 210, 212 and 214 which receive corresponding complementary output signals Bn and Cn (n=1, 2 and 3) from the signal conversion detecting circuits 200, 202 and 204 respectively, and a waveform composing/shaping circuit 220 which receives outputs from the one-shot pulse generating circuits 210 to 214 and outputs an address transition detecting signal (ATD signal) in response to activation of any output pulse signal.

When the inputted address signals An (n=1, 2 and 3) are converted from high levels to low levels or vice versa, the signal conversion detecting circuits 200 to 204 detect the changes and invert the levels of the output signals Bn and Cn which are complementary to each other. It is assumed that the signals Bn and Cn are so converted as to have constant time difference T between inversion timings of the signals Bn and Cn after the conversion of the address signals An.

The one-shot pulse generating circuits 210 to 214 receive the aforementioned complementary time difference signals Bn and Cn, and generate one-shot pulse signals Dn (n=1, 2 and 3). The waveform composing/shaping circuit 220 receives the one-shot pulse signals Dn, composes the same, shapes the pulse duration of the composite signal at a constant value, and thereafter outputs the same.

The ATD signal is outputted from the aforementioned waveform composing/shaping circuit 220. When at least one of the levels of the address signals A1, A2 and A3 is converted, a one-shot pulse is generated in correspondence thereto.

FIG. 10 is a circuit diagram showing exemplary structures of the one-shot pulse generating circuits 210 to 214 and the waveform composing/shaping circuit 200 in the conventional ATD circuit 2000.

Referring to FIG. 10, the one-shot pulse generating circuit 210, for example, includes an AND circuit 240 which receives corresponding complementary time difference signals B1 and C1, and an inversion circuit 242 which receives an output of the AND circuit 240 and outputs an inversion signal. The remaining one-shot pulse generating circuits 212 and 214 are similar in structure to the one-shot pulse generating circuit 210, except that the same receive corresponding complementary difference signals B2 and C2 and B3 and C3 respectively.

The waveform composing/shaping circuit 220 includes N-channel MOS transistors N200, N201 and N202 which are connected between a node E and the ground potential for receiving the one-shot pulse signals Dn outputted from the one-shot pulse generating circuits 210 to 214 respectively, a P-channel MOS transistor P200 having a drain and a source which are connected with the node E and a source potential Vcc respectively, a signal delay circuit 40 which receives the potential of the node E, delays the same by a constant time, and thereafter outputs a corresponding potential to the gate of the P-channel MOS transistor P200, a latch circuit 50 which receives the potential of the node E and holds the same at the level upon input, and an inversion circuit 56 which receives the potential of the node E and outputs the ATD signal which is an inversion signal thereof.

In the aforementioned structure of the waveform composing/shaping circuit 220, the N-channel MOS transistors N200, N201 and N202 share the node E, and form a wired OR circuit. In this example, the signal delay circuit 40 includes four stages of cascade-connected inversion circuits 42 to 48. The latch circuit 50 includes inversion circuits 52 and 54 whose inputs and outputs are connected with each other, so that the output of the inversion circuit 52 and the input of the inversion circuit 54 are connected with the node E.

The inversion circuit 56 operates as a buffer circuit.

Operations of the waveform composing/shaping circuit 220 are now described with reference to a timing chart shown in FIG. 11. FIG. 11 shows time changes of principal signals in the waveform composing/shaping circuit 220 in FIG. 9.

Referring to FIG. 11, the address signal A1 is converted from a low level to a high level at a time u1, whereby the output signals B1 and C1 of the signal conversion detecting circuit 200 are converted from a low level to a high level and from a high level to a low level at times u2 and u3 respectively, as hereinabove described. In this case, both of the signals B1 and C1 are at high levels for a time T in a certain period. These signals B1 and C1 are inputted in the one-shot pulse generating circuit 210, so that the one-shot pulse generating circuit 210 outputs a pulse signal D1 which goes high in the period between the times u2 and u3.

In this case, the potentials of the address lines A2 and A3 remain unchanged, and hence no one-shot pulse signals D2 and D3 are outputted and the output levels of the one-shot pulse generating circuits 212 and 214 remain low.

Therefore, both of the N-channel MOS transistors N201 and N202 remain in OFF states. On the other hand, the one-shot pulse signal D1 goes high at a time u4 between the times u2 and u3, whereby the N-channel MOS transistor N200 enters an ON state at a time u5, so that the potential of the node E is reduced to the ground level.

When the potential of the node E goes low, this potential level is held by the latch circuit 50. Namely, the potential of the node E is held at the low level also when the one-shot pulse signal D1 returns to a low level and the N-channel MOS transistor N200 enters an OFF state at a time u6.

The potential of the node E goes low at the time u5, whereby the signal delay circuit 40 which receives this potential as an input converts the potential of a node F to a low level at a time u7 which is delayed by a constant time. Therefore, the P-channel MOS transistor P200 enters an ON state, and the potential of the node E is raised up to a high level.

At this time, the output state of the latch circuit 50 is also inverted to hold the high level. Therefore, the potential of the node E is held at the high level also when the potential of the node F goes high and the P-channel MOS transistor P200 enters an OFF state at a time u9 by a delay in the signal delay circuit 40 after the potential of the node E goes high.

As a result, a one-shot pulse appears between times u10 and u11 as the ATD signal, due to the potential change of the address line A1 at the time u1. This ATD signal is formed by shaping the pulse duration of the one-shot pulse signal which is outputted from the one-shot pulse generating circuit 210 to prescribed pulse duration by the signal delay circuit 40.

Even if a noise is superimposed on the one-shot pulse signal D1, for example, no influence by this noise appears on the ATD signal due to the presence of the latch circuit 50, unless the noise level exceeds the operation threshold value of the latch circuit 50.

Due to the structures of the one-shot pulse generating circuits 210 to 214 and the waveform composing/shaping circuit 220 shown in FIG. 10, therefore, an ATD circuit which is improved in resistance against noises is implemented.

Description is now made on operations of the one-shot pulse generating circuits 210 to 214 and the waveform composing/shaping circuit 220 which are performed when the potential of the address line A1 is converted from the high level to a low level at a time u12 and the potential of the address line A2 is converted from the low level to a high level at a time u13 in a slight delay.

The potentials of the address lines A1 and A2 are converted at the times u12 and u13 respectively, whereby the signal conversion detecting circuits 200 and 202 and the one-shot pulse generating circuits 210 and 212 operate in response, so that the one-shot pulse signals D1 and D2 enter active states, i.e., high-level one-shot pulses are generated as these signals at times u14 and u15 respectively.

The potential change of the node E is triggered by the one-shot pulse of the signal D1 at the time u14, so that the potential of the node E goes low at a time u16. The pulse of the signal D2 at the time u15 is generated when the potential of the node E is at a low level, and hence no influence is exerted on the potential of the node E even if the N-channel MOS transistor N201 further enters an ON state, since the n-channel MOS transistor N200 has entered an ON state at this time. After a lapse of a prescribed time which is set in the signal delay circuit 40, i.e., at a time u17, therefore, the potential of the node E returns to a high level. An inversion signal of the potential of the node E is outputted as the ATD signal, and hence a high-level pulse is outputted in a period between times u18 and u19.

Namely, an ATD signal which is similar to that upon potential change of only one of three address lines is outputted in this case.

As hereinabove described, the conventional ATD circuit 2000 can output a pulse signal of a constant length as the ATD signal, even if a noise is superimposed on a one-shot pulse signal corresponding to one address line, or the potentials of two or more address lines are converted at a short time interval due to skews of address signals or the like.

However, the conventional ATD circuit 2000 has the following problem:

Consider that the potential of the address line A1 is converted at a time u20, and a potential change of the address line A2 is caused at a time u21, i.e., when conversion of the ATD signal from a high level to a low level is started. In this case, the potential change of the node E is triggered by a one-shot pulse of the signal D1 at a time u22 so that the potential of the node E is at a low level at a time u23, and conversion to a high level is started at a time u24.

Due to a one-shot pulse of the signal D2 at a time u25 which is formed by the potential change of the address line A2 at the time u21, the N-channel MOS transistor N201 enters an ON state and conversion of the potential of the node E to a low level is started again. At this time, the node F is at a low level, and hence the P-channel MOS transistor P200 is in an ON state.

In general, the N-channel MOS transistors N200, N201 and N202 are set to be larger in current drivability than the P-channel MOS transistor P200. When the one-shot pulse signal D2 is at a high level, therefore, the potential of the node E is at a low level. However, the signal D2 is at a high level for a short period, and hence the N-channel MOS transistor N201 immediately enters an OFF state, and the potential of the node E returns to a high level by the P-channel MOS transistor 200 at a time u26. Therefore, the ATD signal which is an inversion signal of the potential of the node E is disadvantageously formed by a shaped pulse signal in a period between times u27 and u28 and an unshaped instable pulse signal between times u29 and u30.

Namely, when the aforementioned potential level change of the address signal is caused by its skew or the like, the ATD signal disadvantageously has an instable pulse waveform in the aforementioned ATD circuit 2000. Thus, a read system circuit which operates by receiving the ATD signal etc. may disadvantageously cause a malfunction.

SUMMARY OF THE INVENTION

An object of the present invention is to provide a semiconductor memory device comprising an ATD circuit which can output an ATD signal of a prescribed length also upon generation of a skew of an address signal or the like.

Briefly stated, provided according to the present invention is a semiconductor memory device, which comprises a memory cell array, a data read circuit, a plurality of address signal lines, and an address transition detecting circuit.

The memory cell array includes a plurality of memory cells which are arranged in the form of a matrix. The data read circuit selects a corresponding memory cell in response to an external address signal, and starts a read operation in response to an address transition detecting signal having a prescribed pulse length. The plurality of address signal lines receive the address signal and transmit the same to a storage information read means. The address transition detecting circuit detects potential changes of prescribed ones of the address signal lines and outputs an address transition detecting signal. The address transition detecting circuit includes a plurality of signal change detecting circuits each outputting first and second detecting signals, being complementary to each other, which are inverted in response to a potential change of a corresponding one of the prescribed address signals, a plurality of pulse generating circuits each outputting a pulse signal having a prescribed pulse length in response to inversion of the corresponding first and second detecting signals, and a signal composing circuit which outputs an address transition detecting signal having a prescribed pulse length and corresponding to an activated pulse signal in response to activation of any one of the pulse signals from the plurality of pulse generating circuits.

Preferably, each of the pulse generating circuits includes an output node which outputs a pulse signal, first and second N-channel MOSFETs which are connected between the output node and a first source potential, a first P-channel MOSFET having a drain which is connected with the output node, second and third P-channel MOSFETs which are connected in parallel between a source of the first P-channel MOSFET and a second source potential, a signal delay circuit which receives the potential of the output node and outputs a corresponding potential to a gate of the first P-channel MOSFET after a lapse of a prescribed time, and a latch circuit which receives the potential of the output node and holds the same at the potential. The second N-channel MOSFET and the second P-channel MOSFET receive a first detecting signal in gates thereof, while the first N-channel MOSFET and the third P-channel MOSFET receive a second detecting signal in gates thereof.

Therefore, a principal advantage of the present invention resides in that the address transition detecting circuit regularly outputs an ATD signal having a sufficient pulse duration even if the address signal has a skew or the like, whereby the data read circuit causes no malfunction.

Another advantage of the present invention resides in that return of the address transition detecting circuit to its initial state is so quickened that the same stably operates even if an abrupt change is caused on the same address line.

The foregoing and other objects, features, aspects and advantages of the present invention will become more apparent from the following detailed description of the present invention when taken in conjunction with the accompanying drawings. BRIEF DESCRIPTION OF THE DRAWINGS FIG. 1 is a block diagram showing the structure of a semiconductor memory device 1 according to a first embodiment of the present invention;

DESCRIPTION OF THE PREFERRED EMBODIMENTS

[First Embodiment]

Figure 1:
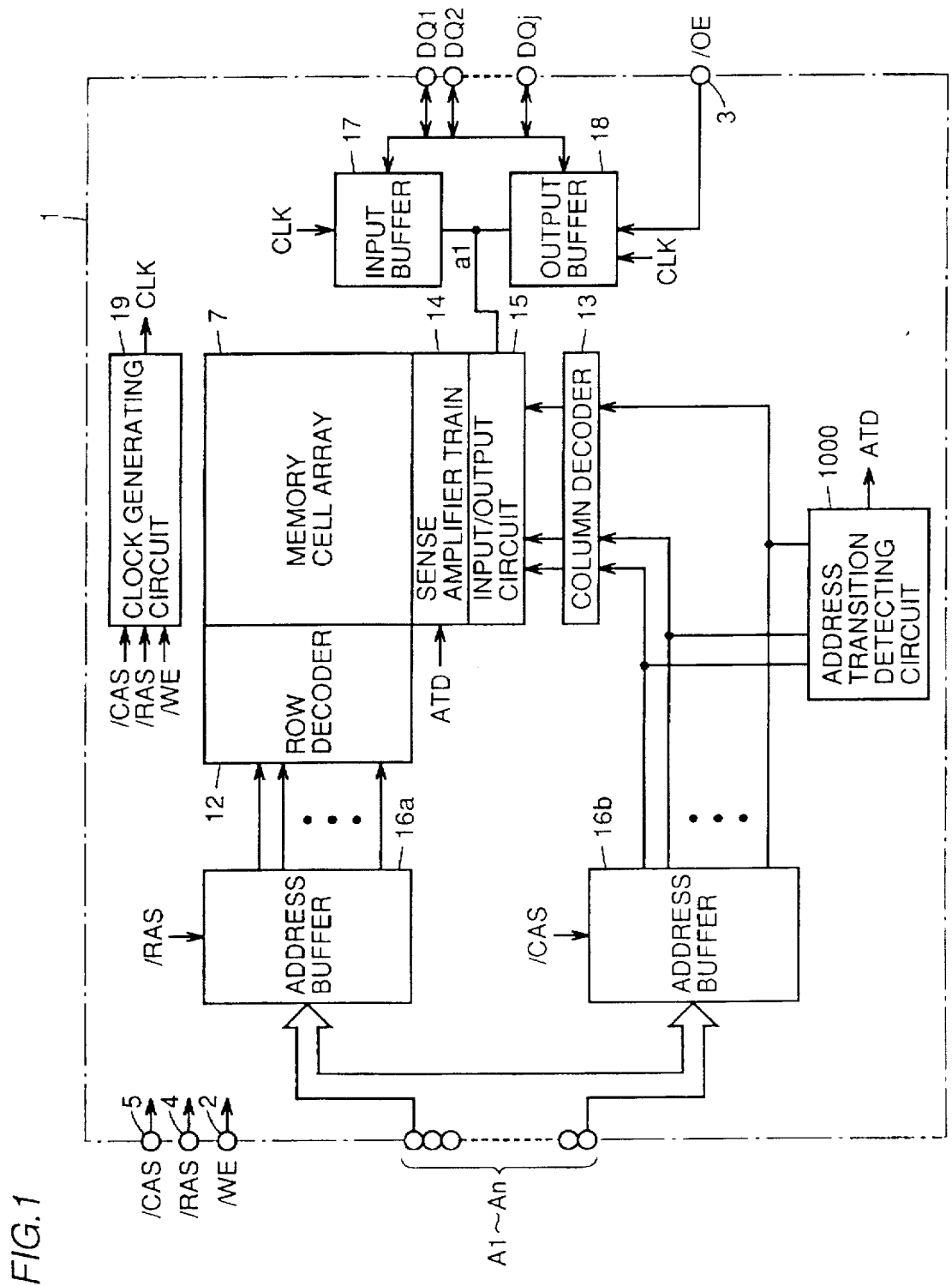

FIG. 1 schematically illustrates the overall structure of a dynamic semiconductor memory device 1 according to a first embodiment of the present invention.

Referring to FIG. 1, the dynamic semiconductor memory device 1 includes a clock generating circuit 19 which receives external control signals /WE, /RAS and /CAS supplied through external control signal input terminals (nodes) 2, 4 and 5 and generates an internal clock signal CLK, a memory cell array 7 in which memory cells holding storage information are arranged in the form of a matrix, address buffers 16a and 16b which receive external address signals A0 to An supplied through address signal input terminals (nodes) 8 and generate internal row and column address signals respectively under control by the clock generating circuit 19, and a row address decoder 12 which is activated under control by the clock generating circuit 19 for decoding the supplied internal row address signal and selecting a row (word line) of the memory cell array 7.

The signal /WE supplied to the external control signal input terminal (node) 2 is a write enable signal which designates data writing. The signal /OE supplied to the external control signal input terminal (node) 3 is an output enable signal which designates data output. The signal/RAS supplied to the external control signal input terminal (node) 4 is a row address strobe signal which starts internal operations of the semiconductor memory device 1 and decides active periods of the internal operations. In activation of the signal /RAS, a circuit such as the row decoder 12 which is related to an operation of selecting a row of the memory cell array 7 is activated. The signal /CAS supplied to the external control signal input terminal (node) 5 is a column address strobe signal, which activates a circuit for selecting a column in the memory cell array 7.

The semiconductor memory device 1 further includes a column decoder 13 which is activated under control by the clock generating circuit 19 for decoding the internal column address signal from the address buffer 16b and selecting a column of the memory cell array 7, a sense amplifier train 14 which detects and amplifies data of memory cells connected with the selected row of the memory cell array 7, an input/output circuit 15 which connects the selected column of the memory cell array 7 to an internal data bus al in response to the column selection signal from the column decoder 13, an input buffer 17 which generates internal write data from external write data DQ0 to DQj supplied to a data input/output terminal 20 in data writing and transmits the same to the internal data bus al, and an output buffer 18 which generates external read data DQ0 to DQj from the internal read data read on the internal data bus al in data reading under control by the clock generating circuit 19 and outputs the same to the data input/output terminal 20.

The semiconductor memory device 1 further includes an address transition detecting circuit 1000 which receives the internal column address signal outputted from the address buffer 16b receiving a signal corresponding to a column address among the external address signals A0 to Ai supplied to the address signal input terminals 8 to the column decoder 13, detects conversion of the column address signal, and outputs an address transition detecting signal ATD. The input/output circuit 15 receives this ATD signal, and starts a preparatory operation for a read operation, i.e., a precharge operation for an I/O line or the like.

The input buffer 17 is activated and generates internal write data when both of the signals /WE and /CAS enter low levels of active states. The output buffer 18 is activated in accordance with activation of the output enable signal /OE.

Figure 2:
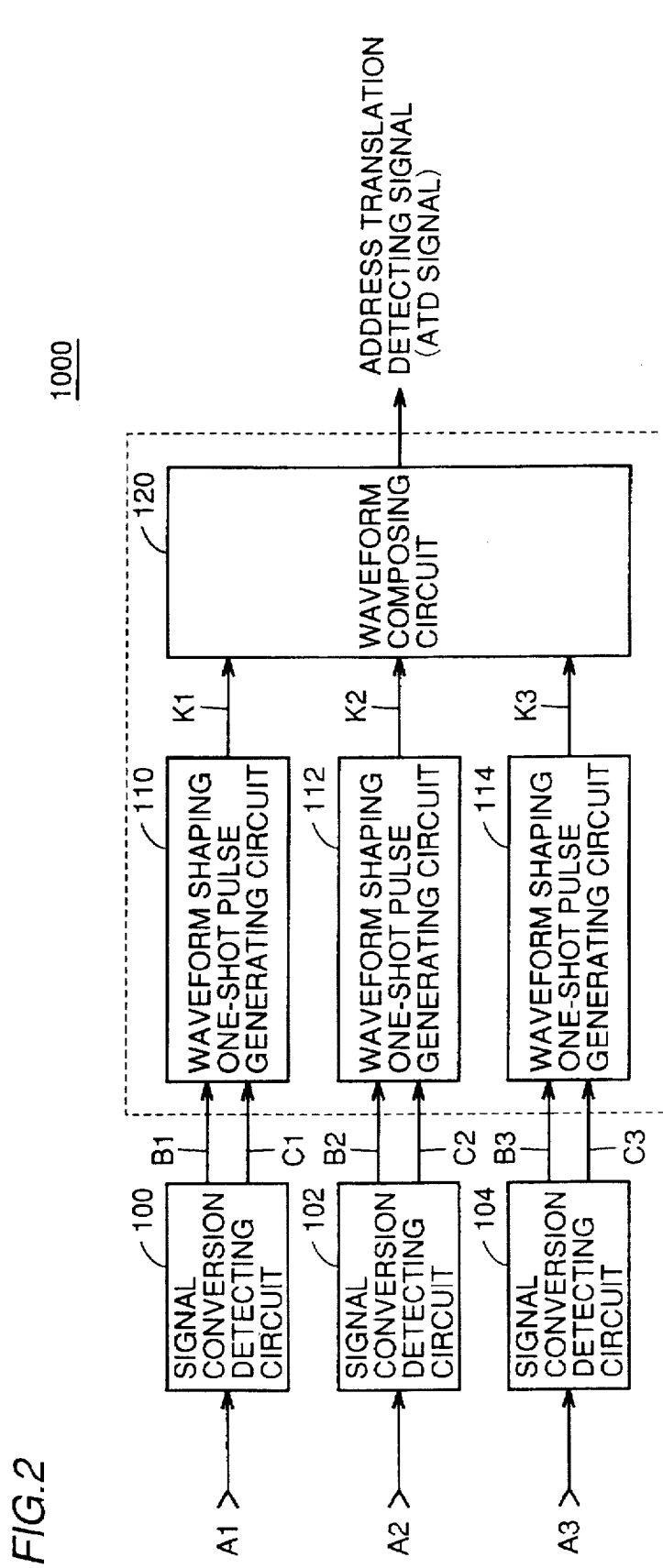
FIG. 2 is a schematic block diagram showing the structure of an address transition detecting circuit 1000 in the semiconductor memory device 1 according to the first embodiment of the present invention.

FIG. 2 is a schematic block diagram showing the structure of the ATD circuit 1000 according to the first embodiment of the present invention. This embodiment is also indicated in relation to address signals of three bits, i.e., three address signals, for simplifying the illustration.

Referring to FIG. 2, the ATD circuit 1000 according to the first embodiment includes signal conversion detecting circuits 100, 102 and 104 whose outputs are connected with independent address lines A1, A2 and A3 respectively for inverting the levels of outputted complementary signals Bn and Cn (n=1, 2 and 3) in correspondence to potential changes of the corresponding address lines A1, A2 and A3 respectively, waveform shaping one-shot pulse generating circuits 110, 112 and 114 which receive the complementary signals Bn and Cn from the corresponding signal conversion detecting circuits 100, 102 and 104 respectively and output one-shot pulses at prescribed time intervals respectively, and a waveform composing circuit 120 which receives one-shot pulse signals K1, K2 and K3 outputted from the waveform shaping one-shot pulse generating circuits 110 to 114 respectively, for composing and outputting a single ATD signal.

When the corresponding address signals An (n=1, 2 and 3) are converted from low levels to high levels or vice versa, the signal conversion detecting circuits 100 to 104 detect the changes and invert the levels of the outputted complementary signals Bn and Cn. When the corresponding address signals An are converted, the signal conversion detecting circuits 100 to 104 invert the levels of the outputted complementary signals Bn and Cn with prescribed time difference therebetween. Therefore, both of the signals Bn and Cn are at high levels for a period of a constant time T.

The waveform shaping one-shot pulse generating circuits 110 to 114 receive the aforementioned time difference signals Bn and Cn respectively, and generate one-shot pulse signals Kn (n=1, 2 and 3) of a prescribed time width Ta in response to the changes thereof. The waveform composing circuit 120 receives the one-shot pulse signals Kn, and outputs the ATD signal, which is a one-shot pulse of the prescribed time width Ta, in response to activation of any one of the one-shot pulse signals Kn.

Namely, the ATD circuit 1000 generates the ATD signal which is a one-shot pulse signal when the potential level of at least one of the address lines A1, A2 and A3 is converted.

The difference between this ATD circuit 1000 and the conventional ATD circuit 2000 resides in that the respective ones of the waveform shaping one-shot pulse generating circuits 110 to 114 which operate in response to potential changes of the respective address lines A1, A2 and A3 have waveform shaping functions so that a stable ATD signal is outputted also when skews are present in the address signals or the like.

The circuit structure of the aforementioned ATD circuit 1000 is now described in further detail.

Figure 3:
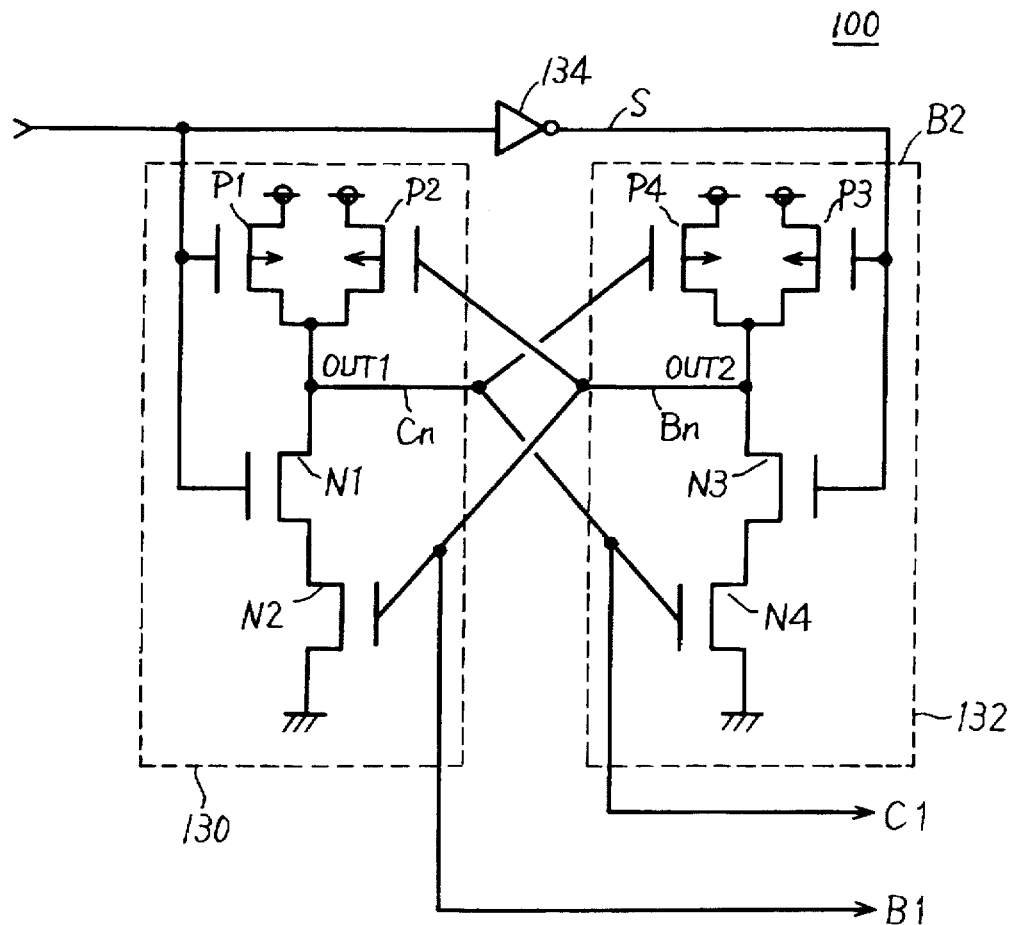
FIG. 3 is a circuit diagram showing the structure of a signal conversion detecting circuit 100 in the first embodiment.

FIG. 3 is a circuit diagram showing an exemplary circuit structure of the signal conversion detecting circuit 100.

Referring to FIG. 3, the signal conversion detecting circuit 100 includes NAND circuits 130 and 132, and an inversion circuit 134.

The NAND circuit 130 has a first input which is connected with the corresponding address line A1, a second input which is connected with an output of the NAND circuit 132, and an output node OUT1 which outputs the complementary time difference signal C1.

The inversion circuit 134 has an input which is connected with the corresponding address line A1, and an output which is connected with a first input of the NAND circuit 132.

The NAND circuit 132 has a second input which is connected with the output node OUT1 of the NAND circuit 130, and an output node OUT2 which outputs the other complementary signal B1.

The NAND circuit 130 includes P-channel MOS transistors P1 and P2 which are connected in parallel between a source potential Vcc and the output node OUT1, and N-channel MOS transistors N1 and N2 which are connected in series between the output node OUT1 and a ground potential Vss. Gates of the P-channel MOS transistor P1 and the N-channel MOS transistor N1 are connected with the corresponding address line A1, while those of the P-channel MOS transistor P2 and the N-channel MOS transistor N2 are connected with the output node OUT2 of the NAND circuit 132.

The NAND circuit 132 includes P-channel MOS transistors P3 and P4 which are connected in parallel between a source potential Vcc and the output node OUT2, and N-channel MOS transistors N3 and N4 which are connected in series between the output node OUT2 and a ground potential Vss. Gates of the P-channel MOS transistor P3 and the N-channel MOS transistor N3 are connected with the output of the inversion circuit 134, while those of the P-channel MOS transistor P4 and the N-channel MOS transistor N4 are connected with the output node OUT1 of the NAND circuit 130.

The signal conversion detecting circuits 102 and 104 are similar in structure to the signal conversion detecting circuit 100 except that inputs thereof are connected with the corresponding address lines A2 and A3 respectively, and hence redundant description is omitted.

Figure 4:
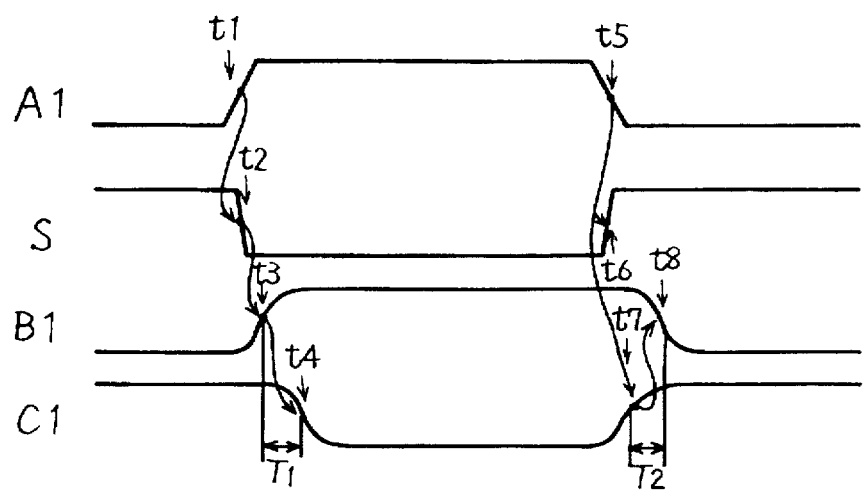
FIG. 4 is a timing chart illustrating operations of the signal conversion detecting circuit 100.

FIG. 4 is a timing chart illustrating the operations of the signal conversion detecting circuit 100 shown in FIG. 3.

Assuming that the address signal A1 is converted from a low level to a high level at a time t1 in FIG. 4, the output S of the inversion circuit 134 is converted from a high level to a low level at a time t2 by its gate delay. At this time, it is assumed that the gate delay of the inversion circuit 134 is st to be minimized on the element characteristic.

It is further assumed that the signal C1 is at a high level, the P-channel MOS transistor P3 is in an OFF state, and the N-channel MOS transistor N4 is in an ON state in an initial state. On the other hand, it is assumed that the signal B1 is at a low level, the P-channel MOS transistor P3 is in an OFF state, and the N-channel MOS transistor N3 is in an ON state in the initial state. Namely, it is assumed that the signal S which is outputted from the inversion circuit 134 and inputted in the gates of the P-channel MOS transistor P3 and the N-channel MOS transistor N3 is at a high level in correspondence to the low potential level of the address line A1 in the initial state.

Then, the signal S is also converted from the high level to a low level in correspondence to the conversion of the signal level of the address line A1 from the low level to a high level. In correspondence thereto, the P-channel MOS transistor P3 enters an ON state and the N-channel MOS transistor N3 enters an OFF state, whereby the signal B1 is converted from the low level to a high level at a time t3. Also in this case, it is assumed that setting such as increase of the size (gate width) of the P-channel MOS transistor P3 is previously made in general, so that the gate delay is minimized.

Then, the P-channel MOS transistor P2 enters an OFF state and the N-channel MOS transistor N1 enters an ON state, due to the conversion of the signal B1 from the low level to a high level. At this time, the potential of the address line A1 is at a high level, whereby the P-channel MOS transistor P1 has already entered an OFF state and the N-channel MOS transistor N2 is in an ON state, and hence the signal C1 is converted from the high level to a low level at a time t4. In this case, it is assumed that setting such as reduction of the size (gate width) of the N-channel MOS transistor N1 is previously made in general, so that the gate delay is increased.

Therefore, constant time difference is set in the period between the times t3 and t4 due to design values of the transistors etc., and hence constant time difference is caused between the changes of the signals B1 and C1 as the result, and both of the signals B1 and C1 are at high levels in a time period $T_1$.

Similarly, when the potential of the address line A1 is converted from the high level to a low level at a time t5, the signal S goes high at a time t6 with no large time difference from the time t5 since the delay time of the inversion circuit 134 is set to be minimized. At this time, the signal B1 is at a high level, the P-channel MOS transistor P2 is in an OFF state, and the N-channel MOS transistor N2 is in an ON state. Thus, the P-channel MOS transistor P1 enters an ON state and the N-channel MOS transistor N1 enters an OFF state since the potential of the address line A1 goes low, whereby the signal C1 goes high at a time t7 with no large time difference from the time t5.

On the other hand, the signal B1 is slowly converted due to the change of the signal C1 at the time t7, to go high at a time t8. Also at this time, constant time difference is caused between the changes of the signals B1 and C1, and both of the signals B1 and C1 are at high levels in a time period $T_2$.

In general, transistor sizes etc. are so set that $T_1 = T_2 = T$.

Due to the aforementioned structure of the signal conversion detecting circuit 100, a structure which is similar to a kind of signal amplification circuit is attained and sensitivity to a potential change of the address line A1 inputted therein is improved. Further, the time difference between the complementary time difference signals B1 and C1 can be made constant by properly setting design parameters such as the sizes of the transistors forming the signal conversion detecting circuit 100 also when the corresponding address signal is converted from a low level to a high level and vice versa, and the ATD signal can be generated at a similar response speed with respect to a change of any address signal.

Figure 5:
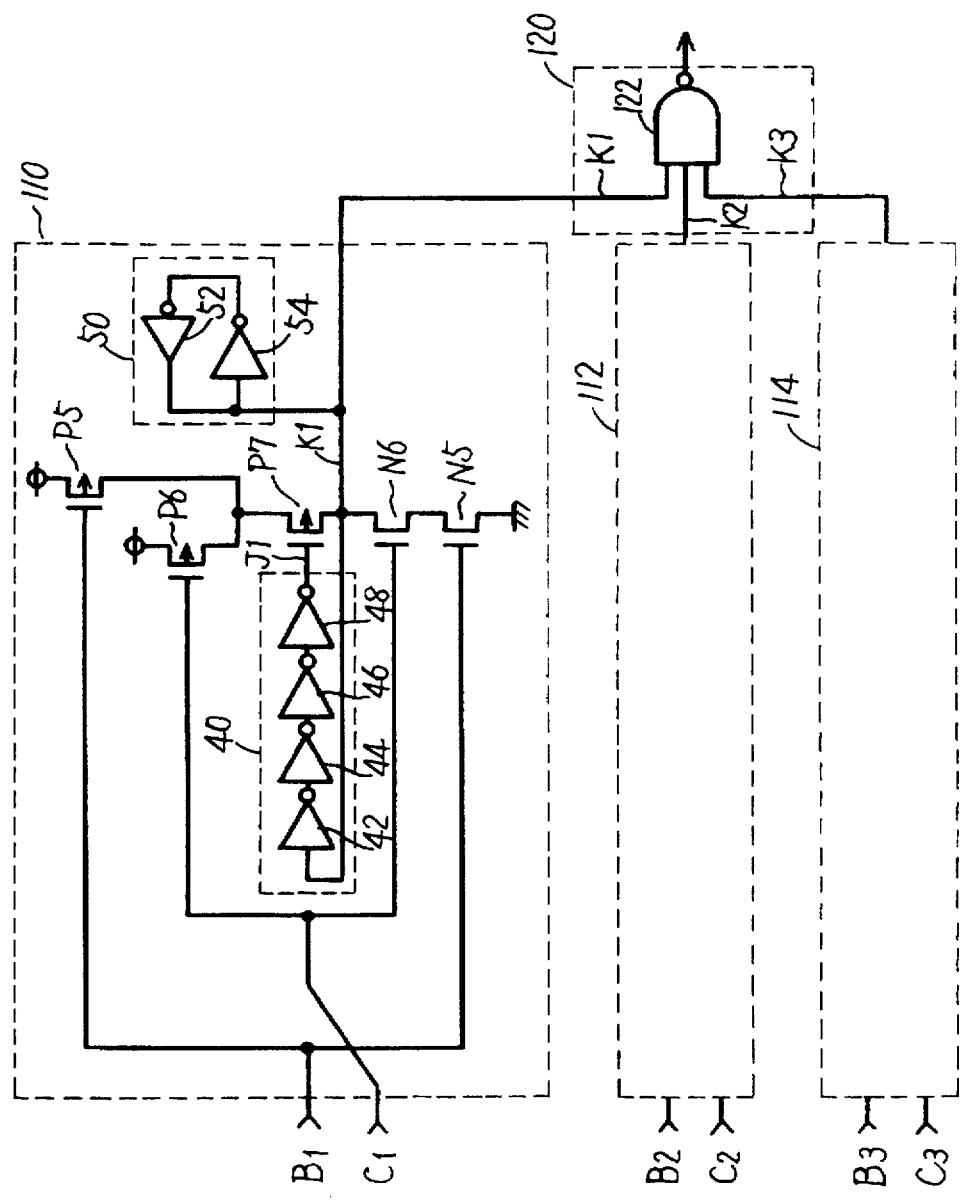
FIG. 5 is a schematic block diagram showing the structures of waveform shaping one-shot pulse generating circuits 110 to 114 and a waveform composing circuit 120 in the first embodiment.

FIG. 5 shows exemplary structures of the waveform shaping one-shot pulse generating circuit 110 and the waveform composing circuit 120 according to the first embodiment. Referring to FIG. 5, the circuit structures of the waveform shaping one-shot pulse generating circuits 112 and 114, which are essentially similar to that of the waveform shaping one-shot pulse generating circuit 110, are omitted.

Referring to FIG. 5, the waveform shaping one-shot pulse generating circuit 110 includes an output node K1, N-channel MOS transistors N5 and N6 which are connected in series between the output node K1 and the ground potential, a P-channel MOS transistor P7 having a drain which is connected with the output node K1, P-channel MOS transistors P5 and P6 which are connected in parallel between a source of the P-channel MOS transistor P7 and a source potential Vcc, a signal delay circuit 40 which receives the potential of the output node K1 and outputs a corresponding potential to the gate of the P-channel MOS transistor P7 after a lapse of a prescribed time, and a latch circuit 50 which receives the potential of the output node K1 and holds the same at the potential.

The complementary time difference signal B1 is inputted in the gates of the N-channel MOS transistor N5 and the P-channel MOS transistor P5. The other complementary time difference signal C1 is inputted in the gates of the N-channel MOS transistor N6 and the P-channel MOS transistor P6.

The signal delay circuit 40 includes even stages (four stages in FIG. 5) of series-connected inversion circuits 42 to 48.

The latch circuit 50 includes inversion circuits 52 and 54 having inputs and outputs which are cross-coupled with each other.

On the other hand, the waveform composing circuit 120 includes a three-input NAND circuit 122 which receives the outputs of the waveform shaping one-shot pulse generating circuits 110 to 114.

Figure 6:
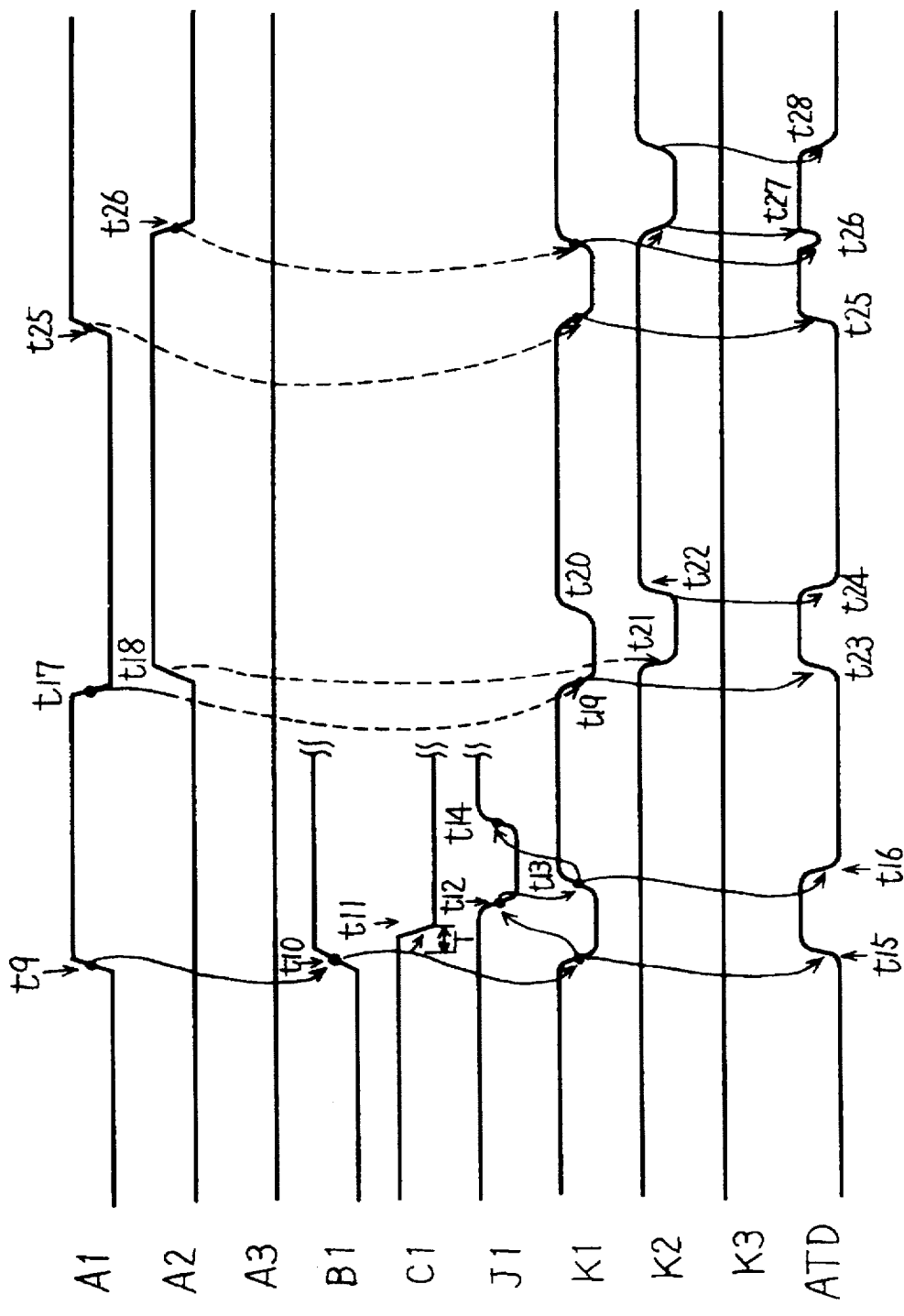
FIG. 6 is a timing chart illustrating operations of the address transition detecting circuit 1000 according to the first embodiment.

FIG. 6 is a timing chart showing operations of the waveform shaping one-shot pulse generating circuits 110 to 114 and the waveform composing circuit 120 shown in FIG. 5.

With reference to FIGS. 5 and 6, the operations are now described.

Assuming that the potential of the address line A1 is converted from a low level to a high level at a time t9, the outputs B1 and C1 of the signal conversion detecting circuit 100 are converted from low and high levels to high and low levels at times t10 and t11 respectively, similarly to the above description with reference to the prior art. In this case, both of the signals B1 and C1 are at high levels in a period for the time T.

It is assumed that the signals B1 and C1 are at low and high levels respectively, and the P-channel MOS transistor P5, the N-channel MOS transistor N5, the P-channel MOS transistor P6 and the N-channel MOS transistor N6 are in OFF, ON, ON and OFF states respectively in advance of the time t10. Assuming that the potential of the output node K1 is at a high level before the time t10, it comes to that the potential of an output node J1 of the signal delay circuit 40 is at a high level, and the P-channel MOS transistor P7 is in an OFF state. At this time, it comes to that the latch circuit 50 holds the potential of the output node K1 at the high level.

When the signal B1 is converted from the low level to a high level, the P-channel MOS transistor P5 enters an OFF state, and the N-channel MOS transistor N5 enters an ON state. The signal C1 is at a low level in the period of the time T from the time t10, i.e., up to the time t11, whereby the N-channel MOS transistor N6 maintains an ON state. Therefore, the N-channel MOS transistors N5 and N6 simultaneously enter ON states while the P-channel MOS transistor P7 maintains the OFF state at this time, whereby the node K1 is so discharged that its potential goes low.

Thus, the potential held by the latch circuit 50 is also inverted to a low level.

At the time t11, the signal C1 is converted from a high level to a low level, the P-channel MOS transistor P6 enters an ON state, and the N-channel MOS transistor N6 enters an OFF state. At this time, the potential of the output node K1 is held at the low level by the latch circuit 50.

When the potential of the output node K1 goes low, the potential of the node J1 goes low in the signal delay circuit 40 at a time t12 in a delay by a constant time from this potential level change of the node K1. Thus, the P-channel MOS transistor P7 enters an ON state so that the transistors P6 and P7 simultaneously enter ON states since the N-channel MOS transistor N6 is in an OFF state and the P-channel MOS transistor P6 is in an ON state at this time, and the output node K1 is charged to a high level at a time t13. Thus, the potential held by the latch circuit 50 is also inverted to a high level.

Due to the conversion of the potential of the output node K1 from the low level to a high level, the potential of the node J1 is converted to a high level by the delay circuit 40 at a time t14 in a delay by a constant time from the potential change of the node K1. At this time, the P-channel MOS transistor P7 enters an OFF state, and the potential of the output node K1 is held at the high level by the latch circuit 50.

Namely, when the potential level of the address line A1 is converted as a result, a one-shot pulse (a negative state is active) which is shaped in pulse duration by the signal delay circuit 40 is generated at the output node K1.

Further, the ATD signal which is outputted from the waveform composing circuit 120 becomes a one-shot pulse signal having a period when the potential of the node K1 which is its input signal is at a low level, i.e., a time width of times t15 and t16.

Description is now made on operations which are performed when the potential of the address line A1 is converted at a time t17 and that of the address line A2 is converted at a time t18 in a slight delay.

Due to the potential change of the address line A1 at the time t17, a negative pulse is generated on the output node K1 of the waveform shaping one-shot pulse generating circuit 110 in a period between times t19 and t20, while a negative pulse is generated on an output node K2 of the waveform shaping one-shot pulse generating circuit 112 in a period between times t21 and t22, due to the potential change of the address line A2 at the time t18.

As the ATD signal, a pulse signal is outputted from the waveform composing circuit 120 in a period when the output node K1 or K2 is negative, i.e., a period between times t23 and t24.

Namely, it comes to that a continuous ATD signal having a time width exceeding a prescribed value is outputted similarly to a case where only the potential of the address line A1 is converted, similarly to the prior art.

Consider that the potential of the address line A1 is converted at a time t25 and the ATD signal is generated in response thereto, while the potential level of the address line A2 is converted at a time t26 when conversion of the ATD signal from a high level to a low level is started.

Also in this case, pulse signals which are outputted from the output nodes K1 and K2 have sufficient time widths respectively, whereby the ATD signal composed in the waveform composing circuit 120 has a sufficient time width as a signal indicating that the potential of the address line A2 is converted at the time t26.

Namely, the ATD signal has a time width which is identical to that in the case where only the potential of one address line is converted in a period between times t27 and t28, dissimilarly to the prior art.

In the conventional ATD circuit 2000, no ATD signal having a sufficient pulse duration indicating a change of the potential level of the address line A2 at the time t26 is outputted when such a change of the address signal is caused by a skew or the like, and hence the circuit which operates by receiving this ATD signal may disadvantageously cause a malfunction.

Namely, a read system circuit receives a one-shot pulse of this ATD signal, starts an operation such as precharging of an I/O line, and reads information from a memory cell which corresponds to a finally ascertained address state.

If the ATD signal indicating that the potential level of the address line A2 is converted has insufficient pulse duration in the above case, however, there is such a possibility that an internal read circuit receiving the ATD signal cannot detect the address change and disadvantageously accesses a memory cell corresponding to an address which is different from the externally specified one. In the ATD circuit 1000 provided in the semiconductor memory device 1 according to the first embodiment of the present invention, however, an ATD signal having sufficient pulse duration is regularly outputted even if a skew is present in the address signal, whereby no malfunction is caused dissimilarly to the above.

Further, the signal conversion detecting circuits 100 to 104 detecting changes of the address signals for generating the ATD signal are improved in detection sensitivity due to the amplifying functions. In addition, the waveform shaping one-shot pulse generating circuits 110 to 114 are driven by the complementary time difference signals whose mutual delay times can be set at arbitrary values by design parameters, whereby the ATD signal can be generated at a constant response speed with respect to conversion of the address signals from high levels to low levels and vice versa.

[Second Embodiment]

According to the first embodiment, the waveform shaping one-shot pulse generating circuits 110 to 114 output one-shot pulse signals of prescribed lengths respectively upon detection of potential changes of the respective address lines, so that the waveform composing circuit generates an ATD signal of a prescribed pulse length in response thereto.

Even if skews or the like are present in level changes of the address signals which are applied to the address signal lines, therefore, a cause for such a malfunction that the pulse length of the outputted ATD signal is extremely reduced is suppressed.

When an address signal which is applied to a single address line is converted at a short time interval, however, the structure of the first embodiment may be insufficient. In the first embodiment, the signal delay circuit 40 has a function of converting the gate potential of the P-channel MOS transistor P7 from a high level to a low level and bringing this transistor P7 into an ON state after a certain time interval when the potential of the output node K1 is converted from a high level to a low level, thereby raising up the potential level of the output node K1 from the low level to a high level after a lapse of the aforementioned constant time.

The ATD signal is outputted in response to the potential change of the output node K1, and hence a necessary circuit operation is basically completed at a point of time when the potential of the output node K1 returns to the high level.

However, after a further lapse of a constant time from the return of the output node K1 to the high level, the signal delay circuit 40 makes the gate potential of the P-channel MOS transistor P7 return to a high level, whereby the state of the overall circuit returns to the initial state.

When the potential level of a certain address line is converted at a high speed, therefore, presence of the period of the prescribed time (the time T) which is required extra for making the waveform shaping one-shot pulse generating circuit return to its initial state may cause a delay of the circuit operation or a malfunction of the outputted signal level.

According to a second embodiment of the present invention, the structure of the signal delay circuit 40 according to the first embodiment is changed to the following structure, in order to eliminate the aforementioned inconvenience.

Figure 7:
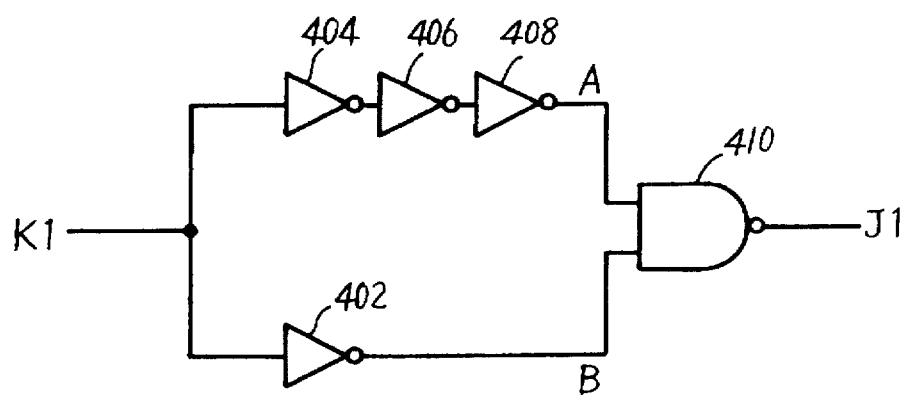
FIG. 7 is a circuit diagram showing the structure of a signal delay circuit 42 in an address transition detecting circuit according to a second embodiment of the present invention.

FIG. 7 is a schematic block diagram showing the structure of a signal delay circuit 42 in a waveform shaping one-shot pulse generating circuit which is provided in a semiconductor memory device according to the second embodiment.

The signal delay circuit 42 includes three stages of cascade-connected inversion circuits 404 to 408 having inputs which are connected with an output node K1, an inversion circuit 402 having an input which is connected with the output node K1, and a NAND circuit 410 which receives outputs of the final stage inversion circuit 408 of those cascade-connected in three stages and the inversion circuit 402 and has an output connected with a node J1 which is connected with the gate of a P-channel MOS transistor P7.

Operations of the signal delay circuit 42 are now described.

Figure 8:
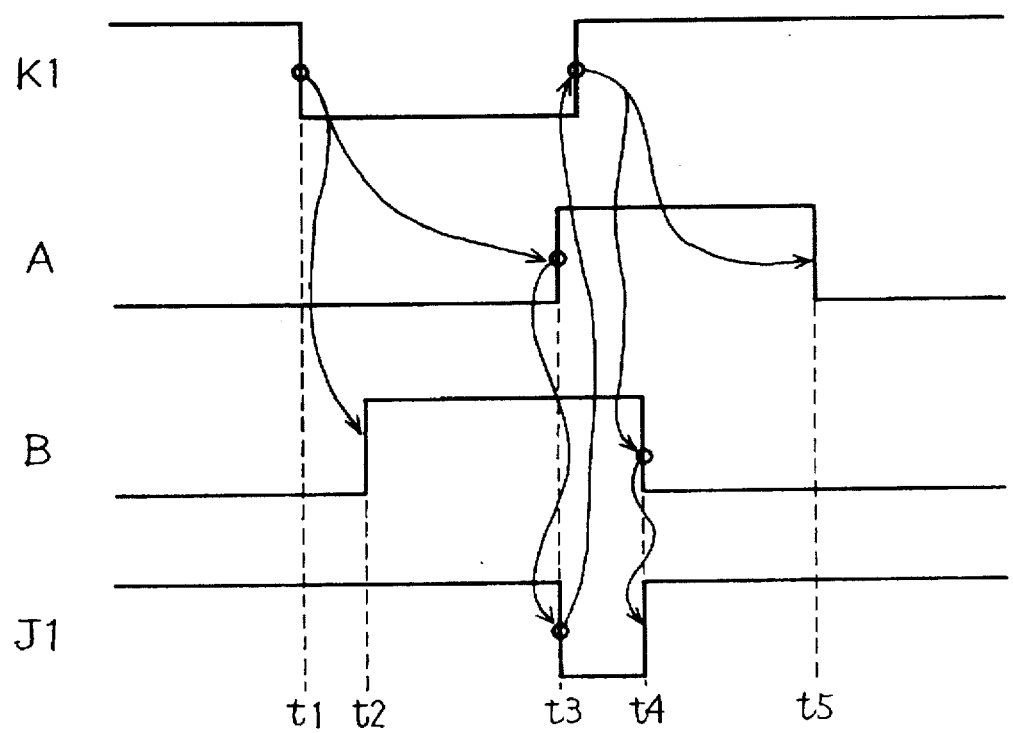
FIG. 8 is a timing chart illustrating operations of the signal delay circuit 42.
Figure 9:
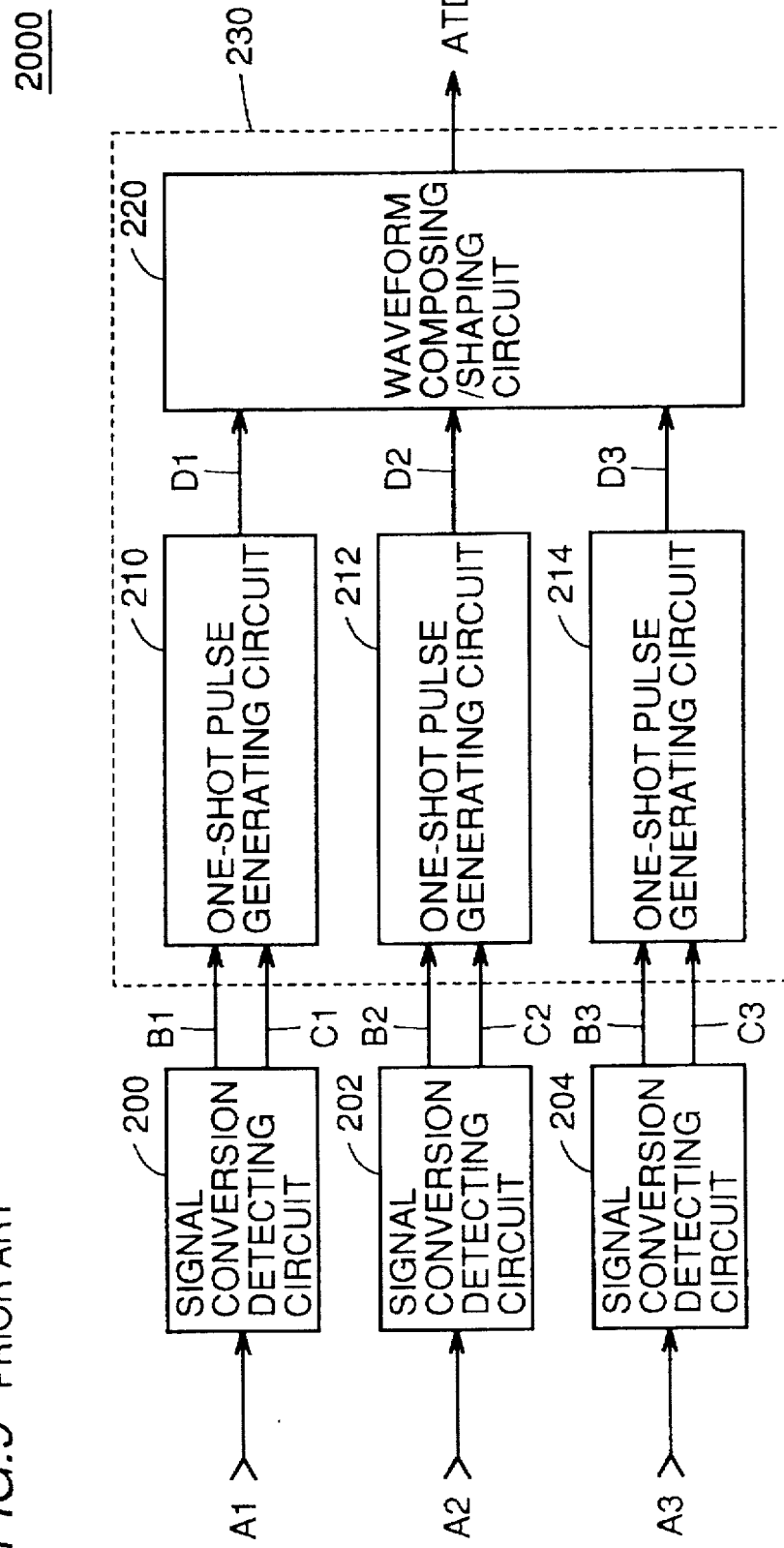
FIG. 9 is a schematic block diagram showing the structure of a conventional address transition detecting circuit 2000.
Figure 10:
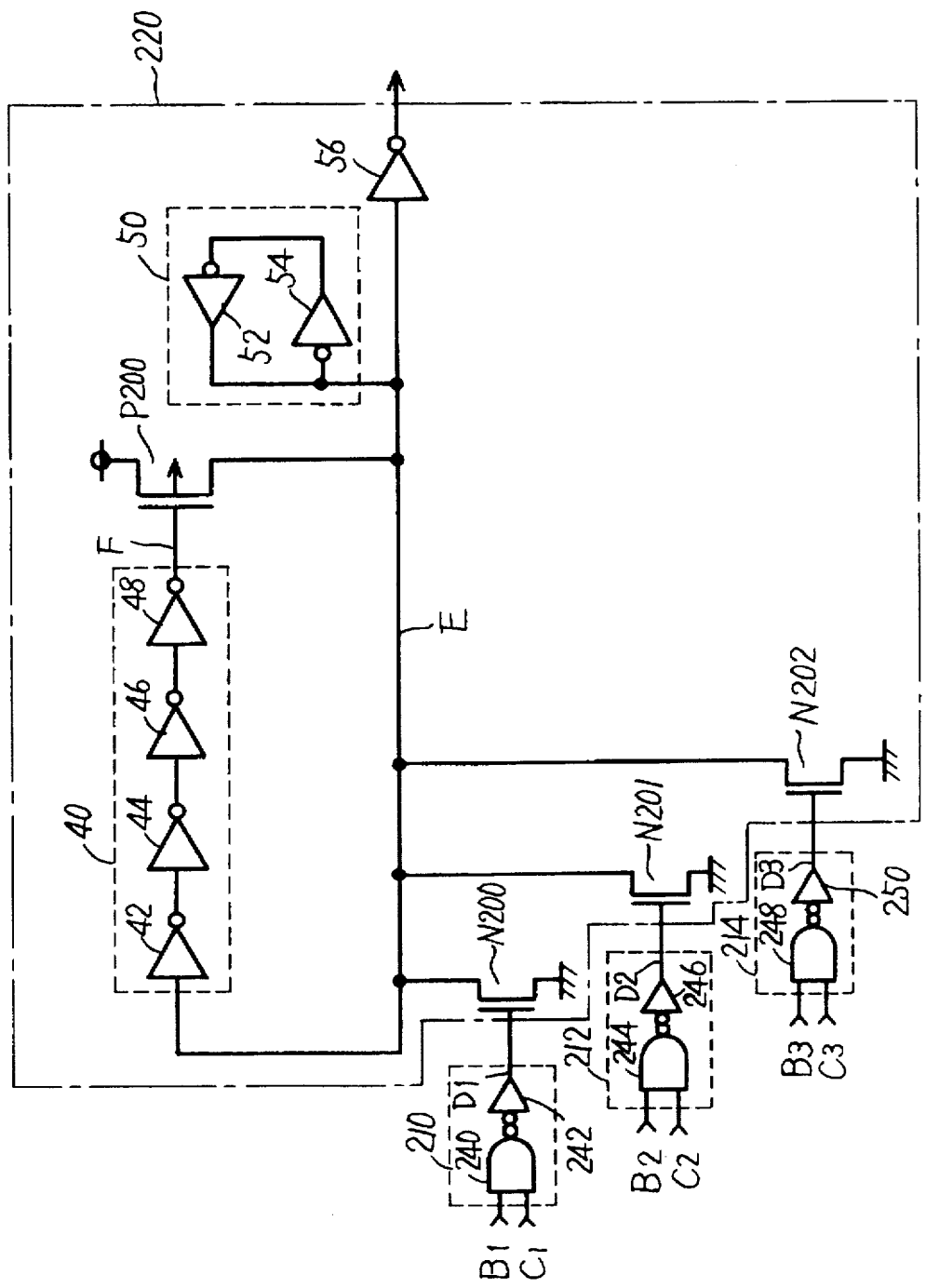
FIG. 10 is a schematic block diagram showing the structures of one-shot pulse generating circuits 210 to 214 and a waveform composing/shaping circuit 220 in the conventional address transition detecting circuit 2000.
Figure 11:
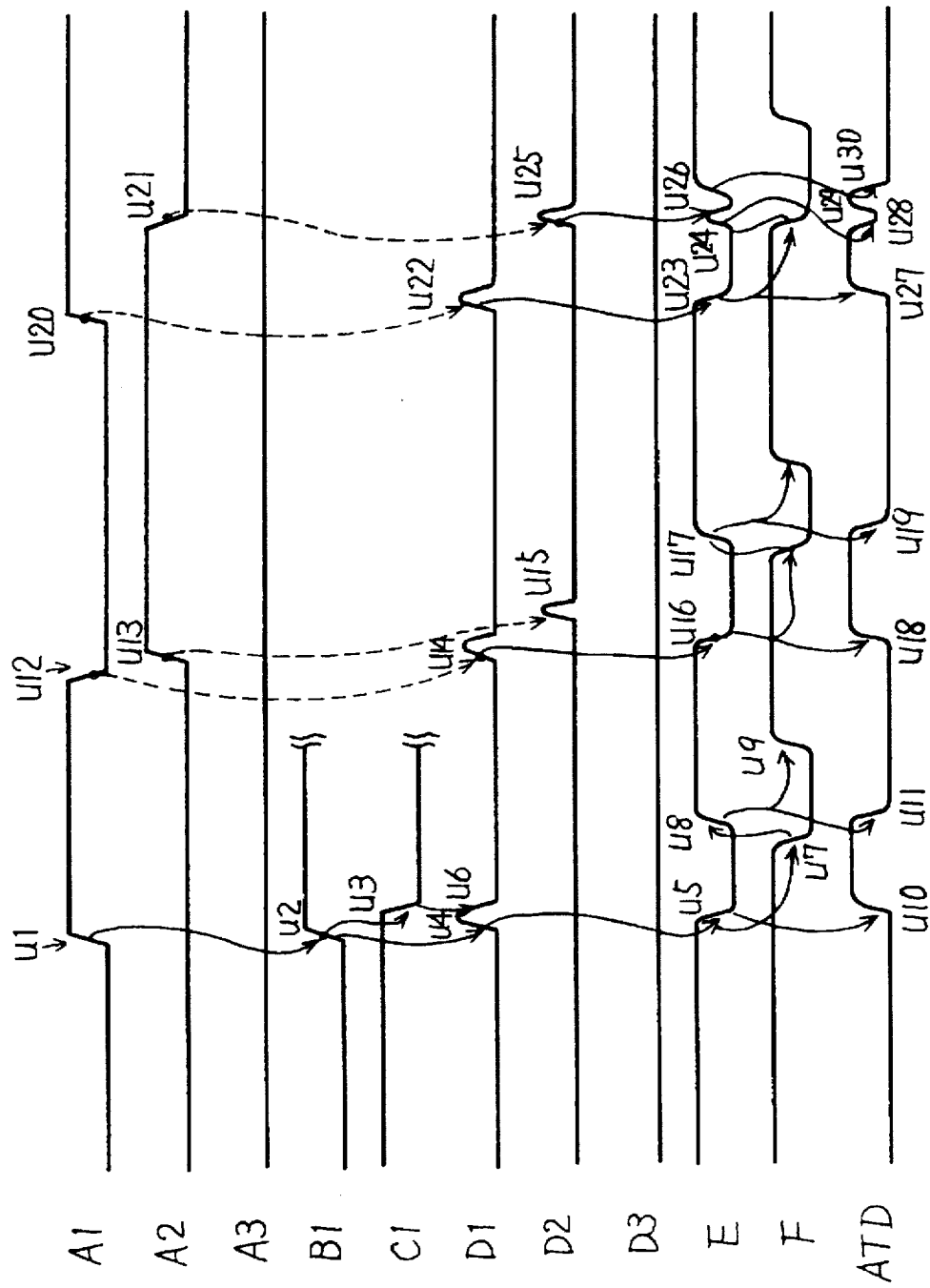
FIG. 11 is a timing chart illustrating operations of the conventional address transition detecting circuit 2000.

FIG. 8 is a timing chart illustrating the operations of the signal delay circuit 42.

The potential of the output node K1 is converted from a high level to a low level at a time t1, whereby the potential of an input node B of the NAND circuit 410 is converted from a low level to a high level after a delay time for one stage of the inversion circuit 402. On the other hand, an output of the cascade-connected inversion circuits 404 to 408 (the potential of another input node A of the NAND circuit 410) is converted from a low level to a high level at a time t3 which is in a delay from the time t2.

In response to this, the potential of an output node of the NAND circuit 410, i.e., the node J1, is converted from a high level to a low level at the time t3. Thus, the P-channel MOS transistor P7 enters an ON state, and the potential of the output node K1 returns to a high level again. In response to the potential change of the output node K1, the output of the inversion circuit 402 is converted to a low level at a time t5, whereby the output of the NAND circuit 410, i.e., the potential of the node J1, returns to the high level.

In the signal delay circuit 42 according to the second embodiment, therefore, the gate potential of the P-channel MOS transistor P7 returns to a high level in the initial state after the potential of the output node K1 is converted to a low level and thereafter returns to a high level again, only with a delay by a delay time of the inversion circuit 402.

Thus, no long time is required for return to the initial state, dissimilarly to the signal delay circuit 40 according to the first embodiment.

In other words, a stable operation can be performed even if an abrupt change is caused in a certain address line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of memory cells being arranged in the form of a matrix;

data read means selecting a corresponding one of said memory cells in response to an external address signal and starting a read operation in response to an address transition detecting signal having a prescribed pulse length;

a plurality of address signal lines receiving said address signal and transmitting the same to said data read means; and address transition detecting means detecting a potential change of prescribed one of said address signal lines and outputting said address transition detecting signal, said address transition detecting means including:

a plurality of signal change detecting means each outputting first and second detecting signals, being complementary to each other, being inverted in response to a potential change of a corresponding one of said prescribed address signal lines, a plurality of pulse generating means each outputting a pulse signal having said prescribed pulse length in response to inversion of corresponding said first and second detecting signals, and signal composing means outputting said address transition detecting signal having said prescribed pulse length in response to activation of any of said pulse signals from said plurality of pulse generating means, wherein each of said plurality of signal change detecting means comprises an inverter circuit and cross-coupled logic gates.

2. A semiconductor memory device, comprising:

a memory cell array including a plurality of memory cells being arranged in the form of a matrix;

data read means selecting a corresponding one of said memory cells in response to an external address signal and starting a read operation in response to an address transition detecting signal having a prescribed pulse length;

a plurality of address signal lines receiving said address signal and transmitting the same to said data read means; and address transition detecting means detecting a potential change of prescribed one of said address signal lines and outputting said address transition detecting signal, said address transition detecting means including a plurality of signal change detecting means each outputting first and second detecting signals, being complementary to each other, being inverted in response to a potential change of a corresponding one of said prescribed address signal lines, a plurality of pulse generating means each outputting a pulse signal having said prescribed pulse length in response to inversion of corresponding said first and second detecting signals, and signal composing means outputting said address transition detecting signal having said prescribed pulse length in response to activation of any of said pulse signals from said plurality of pulse generating means, wherein each of said pulse generating means includes an output node outputting said pulse signal, discharge means discharging said output node in response to inversion of said first and second detecting signals being complementary to each other, delay switching means charging said output node in response to a lapse of a prescribed time often a potential change of said output node by said discharging, and latch means receiving a potential of said output node and holding said potential of said output node at said potential.

3. A semiconductor memory device, comprising:

a memory cell array including a plurality of memory cells being arranged in the form of a matrix;

data read means selecting a corresponding one of said memory cells in response to an external address signal and starting a read operation in response to an address transition detecting signal having a prescribed pulse length;

a plurality of address signal lines receiving said address signal and transmitting the same to said data read means; and address transition detecting means detecting a potential change of prescribed one of said address signal lines and outputting said address transition detecting signal, said address transition detecting means including a plurality of signal change detecting means each outputting first and second detecting signals, being complementary to each other, being inverted in response to a potential change of a corresponding one of said prescribed address signal lines, a plurality of pulse generating means each outputting a pulse signal having said prescribed pulse length in response to inversion of corresponding said first and second detecting signals, and signal composing means outputting said address transition detecting signal having said prescribed pulse length in response to activation of any of said pulse signals from said plurality of pulse generating means, wherein each of said pulse generating means includes an output node outputting said pulse signal, first and second N-channel MOSFETs being connected between said output node and a first source potential, a first P-channel MOSFET having a drain being connected with said output node, second and third P-channel MOSFETs being connected in parallel between a source of said first P-channel MOSFET and a second source potential, signal delay means receiving a potential of said output node and outputting a corresponding potential to a gate of said first p-channel MOSFET after a lapse of a prescribed time, and latch means receiving said potential of said output node and holding said potential of said output node at said potential, said second N-channel MOSFET and said second P-channel MOSFET receive said first detecting signal in gates thereof, and said first N-channel MOSFET and said third P-channel MOSFET receive said second detecting signal in gates thereof.

4. The semiconductor memory device according to claim 3, wherein each of said signal change detecting means includes:

first and second internal output nodes outputting said first and second detecting signals respectively, third and fourth N-channel MOSFETs being connected in series between said first internal output node and said first source potential, fourth and fifth P-channel MOSFETs being connected in parallel between said first internal output node and said second source potential, fifth and sixth N-channel MOSFETs being connected in series between said second internal output node and said first source potential, sixth and seventh P-channel MOSFETs being connected in parallel between said second internal output node and said second source potential, and an inversion circuit receiving a potential of said address signal line and outputting inverted said potential, said third N-channel MOSFET and said fourth P-channel MOSFET receive said potential of said address signal line in gates thereof while said fifth N-channel MOSFET and said sixth P-channel MOS- FET receive an output of said inversion circuit in gates thereof respectively, gates of said fourth N-channel MOSFET and said fifth P-channel MOSFET are connected with said second internal output node, and gates of said sixth N-channel MOSFET and said seventh P-channel MOSFET are connected with said first internal output node.

5. The semiconductor memory device according to claim 3, wherein said signal delay means includes:

first odd stages of first cascade-connected inversion circuits receiving said potential of said output node, second odd stages of second cascade-connected inversion circuits receiving said potential of said output node, and a NOT-AND operation circuit receiving outputs of said first and second cascade-connected inversion circuits and having an output being connected with a gate of said first P-channel MOSFET.

6. The semiconductor memory device according to claim 5, wherein each of said signal change detecting means includes:

first and second internal output nodes outputting said first and second detecting signals respectively, third and fourth N-channel MOSFETs being connected in series between said first internal output node and said first source potential, fourth and fifth P-channel MOSFETs being connected in parallel between said first internal output node and said second source potential, fifth and sixth N-channel MOSFETs being connected in series between said second internal output node and said first source potential, sixth and seventh P-channel MOSFETs being connected in parallel between said second internal output node and said second source potential, and an inversion circuit receiving a potential of said address signal line and outputting inverted said potential, said third N-channel MOSFET and said fourth P-channel MOSFET receive said potential of said address signal line in gates thereof while said fifth N-channel MOSFET and said sixth P-channel MOSFET receive an output of said inversion circuit in gates thereof respectively, gates of said fourth N-channel MOSFET and said fifth P-channel MOSFET are connected with said second internal output node, and gates of said sixth N-channel MOSFET and said seventh P-channel MOSFET are connected with said first internal output node.

7. The semiconductor memory device according to claim 1, wherein an input of the inverter circuit is connected to a corresponding one of said plurality of address signal lines and an output of said inverter circuit is connected to an input of one of said cross-coupled logic gates, an input of another cross-coupled logic gates is connected to said corresponding one of said plurality of address signal lines, and said cross-coupled logic gates output said first and second detecting signals.

* * * * *